United States Patent
Hsu et al.

(10) Patent No.: US 7,126,384 B2
(45) Date of Patent: Oct. 24, 2006

(54) PEAK DETECTION CIRCUIT WITH DOUBLE PEAK DETECTION STAGES

(75) Inventors: Tse-Hsiang Hsu, Hsin Chu (TW);
Yung-Yu Lin, Hsin Chu (TW);
Chih-Cheng Chen, Hsin Chu (TW)

(73) Assignee: MediaTek Inc., Hsin Chu (TW)

( * ) Notice: Subject to any disclaimer, the term of this patent is extended or adjusted under 35 U.S.C. 154(b) by 0 days.

(21) Appl. No.: 10/737,746

(22) Filed: Dec. 18, 2003

(65) Prior Publication Data
US 2004/0124885 A1 Jul. 1, 2004

(30) Foreign Application Priority Data
Dec. 23, 2002 (TW) .............................. 91137093 A

(51) Int. Cl.
*H03K 5/153* (2006.01)

(52) U.S. Cl. .................... 327/58; 327/62; 327/59; 327/60

(58) Field of Classification Search ............ 327/58, 327/62, 59, 60, 61; 341/108, 132, 155; 375/98; 356/308; 365/308
See application file for complete search history.

(56) References Cited

U.S. PATENT DOCUMENTS

| | | | | |
|---|---|---|---|---|
| 3,835,400 A | * | 9/1974 | Briscoe | 327/331 |
| 3,878,984 A | * | 4/1975 | Sotiropoulos et al. | 702/157 |
| 4,373,141 A | * | 2/1983 | Sanders | 327/61 |
| 4,499,586 A | * | 2/1985 | Cafarella et al. | 375/345 |
| 4,709,204 A | * | 11/1987 | Hayakawa | 323/303 |
| 5,177,560 A | * | 1/1993 | Stimple et al. | 356/308 |
| 5,302,863 A | * | 4/1994 | Walley et al. | 327/60 |
| 5,666,379 A | * | 9/1997 | Ovard et al. | 375/239 |

* cited by examiner

*Primary Examiner*—Tuan T. Lam
*Assistant Examiner*—Hiep Nguyen
(74) *Attorney, Agent, or Firm*—Birch, Stewart, Kolasch & Birch, LLP

(57) ABSTRACT

A peak detection circuit with double peak detection stages includes an analog peak detector, an analog-to-digital converter (ADC), and a digital peak detector. The analog peak detector receives an analog input signal, detects a peak value of the analog input signal with a first period, and outputs an analog peak signal. The ADC receives the analog peak signal and converts it into a digital signal. The digital peak detector receives the digital signal, detects the peak value of the digital signal with a second period longer than the first period, and outputs a digital peak signal. Therefore, the analog peak signal will not decay seriously due to the leakage and the digital peak signal can hold the digital peak value for a long time.

6 Claims, 7 Drawing Sheets

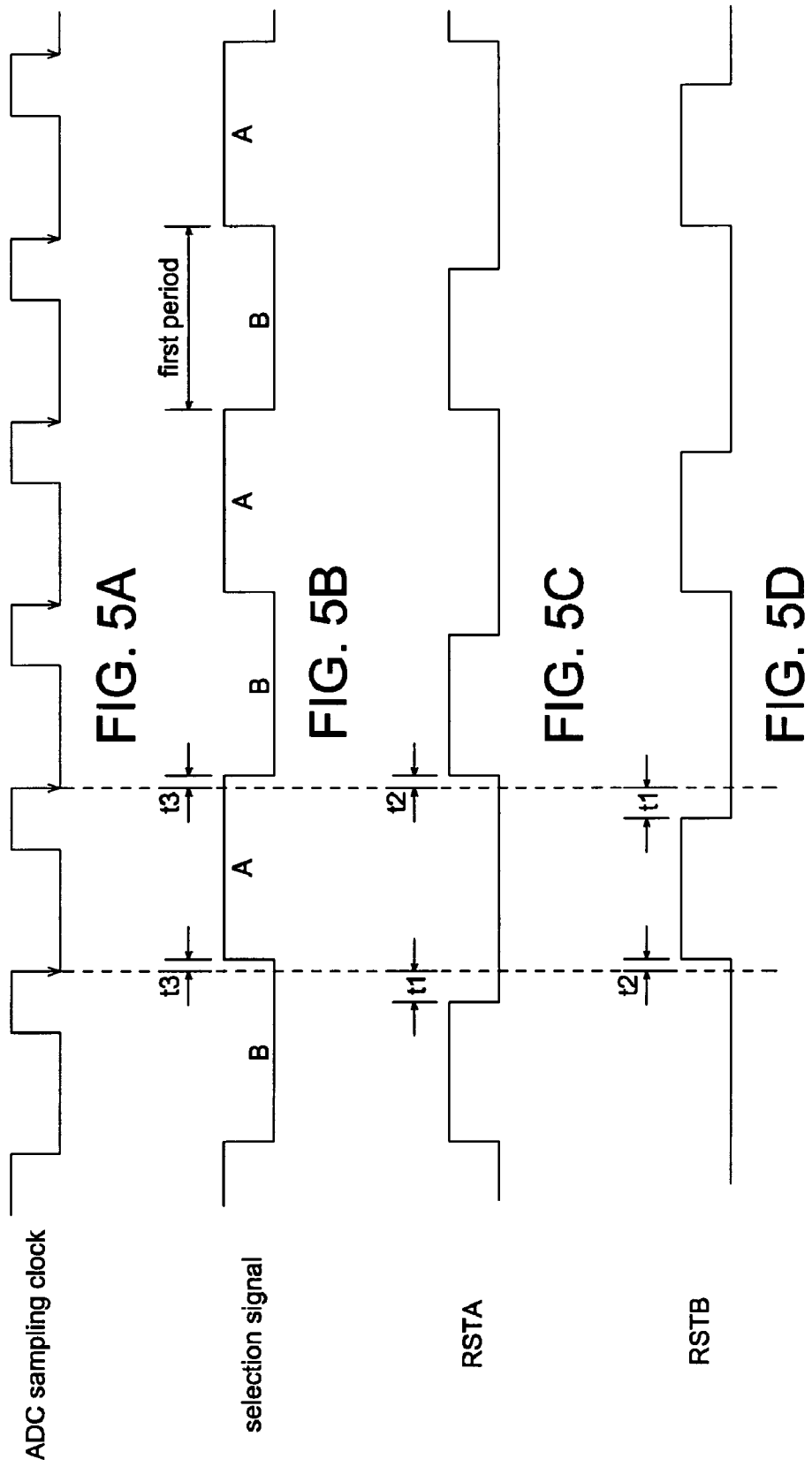

RF signal analog peak signal

ADC sampling clock

ADC output signal

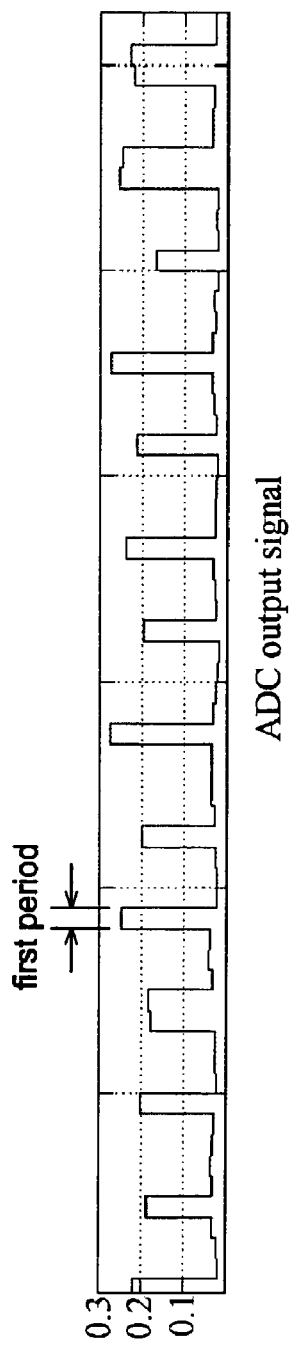
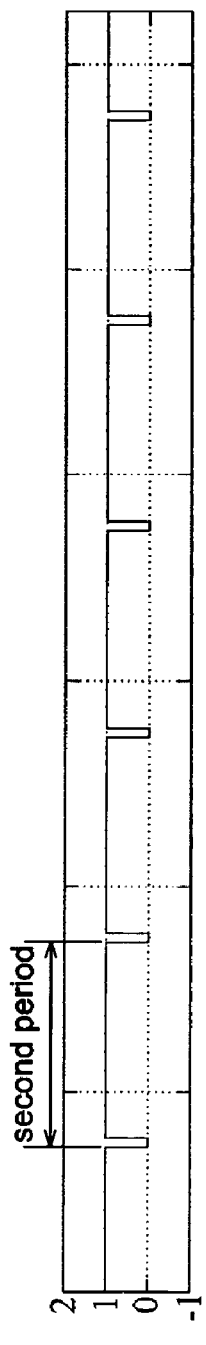
FIG. 7A
FIG. 7B
FIG. 7C

PEAK DETECTION CIRCUIT WITH DOUBLE PEAK DETECTION STAGES

This Nonprovisional application claims priority under 35 U.S.C. § 119(a) on patent application Ser. No. 091137093 filed in TAIWAN on Dec. 23, 2002, the entire contents of which are hereby incorporated by reference.

BACKGROUND OF THE INVENTION

1. Field of the Invention

The invention relates to a peak detection circuit, and more particularly to a peak detection circuit, which has an analog and a digital peak detectors, to hold the peak value for a long time.

2. Description of the Related Art

In order to detect the frequency of the wobbling tracks of a typical DVD-R (Digital versatile disk Recordable) correctly, the pre-pits for recording the address information are additionally formed between adjacent tracks. Because the pre-pits are uniformly formed over the entire surface of the DVD-R, the reference addresses of the DVD-R may be reproduced from the pre-pits.

FIG. 1 shows an architecture diagram of a slicing device for slicing the pre-pit signal in a typical DVD-R recorder. As shown in FIG. 1, the slicing device 10 utilizes a low-pass filter (LPF) 11 to filter out the high-frequency components of the input signal RF and then generate an average signal. Next, the slicing device utilizes an adder 12 to add a constant voltage 13 to the average signal and then generate a reference signal. Finally, the slicing device 10 utilizes a comparator 14 to compare the input signal RF with the reference signal and thus to generate the pre-pit signal.

In general, the amplitude of the pre-pit signal is influenced by many factors, including the quality and reflectance of the DVD-R and the property and position of the pick-up head in the optical driver. Therefore, if the reference signal is generated by adding a constant voltage as shown in FIG. 1, slicing errors may be caused owing to the amplitude variation of the pre-pit signal.

FIG. 2 shows an architecture diagram of another slicing device for slicing a pre-pit signal in a DVD-R recorder. Referring to FIG. 2, the slicing device 20 includes a low-pass filter (LPF) 11, a peak detector 22, a voltage computing unit 23, and a comparator 14. The device 20 utilizes the peak detector 22 to detect the peak voltage of the RF signal, and simultaneously utilizes the low-pass filter 11 to filter out the high-frequency components of the RF signal, and then to generate an average signal. Next, the voltage computing unit 23 is utilized to add the peak voltage to the average signal, and then the reference signal is generated by multiplying the sum by a gain such as 0.5 by a voltage regulator 232. Finally, the slicing device 20 utilizes a comparator 14 to compare the RF signal with the reference signal and then to generate the pre-pit signal.

However, if the holding time for the typical peak detector becomes longer, the latched voltage is not the true peak voltage owing to the current leakage. If the capacitor is enlarged in order to reduce the effect of current leakage, the response time of the peak detector will be lengthened and it is difficult to detect each peak signal.

SUMMARY OF THE INVENTION

In view of the above-mentioned problems, an object of the invention is to provide a peak detection circuit with analog and digital peak detectors so as to hold the peak value for a long time and to possess a quick response speed.

To achieve the above-mentioned object, the invention provides a peak detection circuit with double peak detection stages. The peak detection circuit includes an analog peak detector, an analog-to-digital converter (ADC), and a digital peak detector. The analog peak detector receives an analog input signal, periodically detects a peak value of the analog input signal with a first period, and outputs an analog peak signal. The ADC receives the analog peak signal and converts it into a digital signal. The digital peak detector receives the digital signal, periodically detects the peak value of the digital signal with a second period, and outputs a digital peak signal.

The first period is shorter than the second period. Therefore, it is unnecessary to hold the peak value, which is detected by the analog peak detector, for a long time, so as to reduce the influence of the current leakage, and to obtain and hold the digitized peak value with a longer second period.

BRIEF DESCRIPTION OF THE DRAWINGS

FIGS. 5A to 5D show schematic illustrations of controls signals of the control units, wherein FIG. 5A shows the ADC sampling clock, FIG. 5B shows the selection signal, FIG. 5C shows the reset signal RSTA, and FIG. 5D shows the reset signal RSTB.

FIGS. 6A to 6D show schematic illustrations of some signals of the pre-pit signal detector applied to the optical disk system of the invention, wherein FIG. 6A shows the RF signal, FIG. 6B shows the analog peak signal, FIG. 6C shows the ADC sampling clock, and FIG. 6D shows the ADC output signal.

FIGS. 7A to 7C show schematic illustrations of some signals of the pre-pit signal detector applied to the optical disk system of the invention, wherein FIG. 7A shows the ADC output signal, FIG. 7B shows the cycle clock, and FIG. 7C shows the digital peak signal.

DETAILED DESCRIPTION OF THE INVENTION

The peak detection circuit with double peak detection stages will be described with reference to the accompanying drawings.

Figure 1:
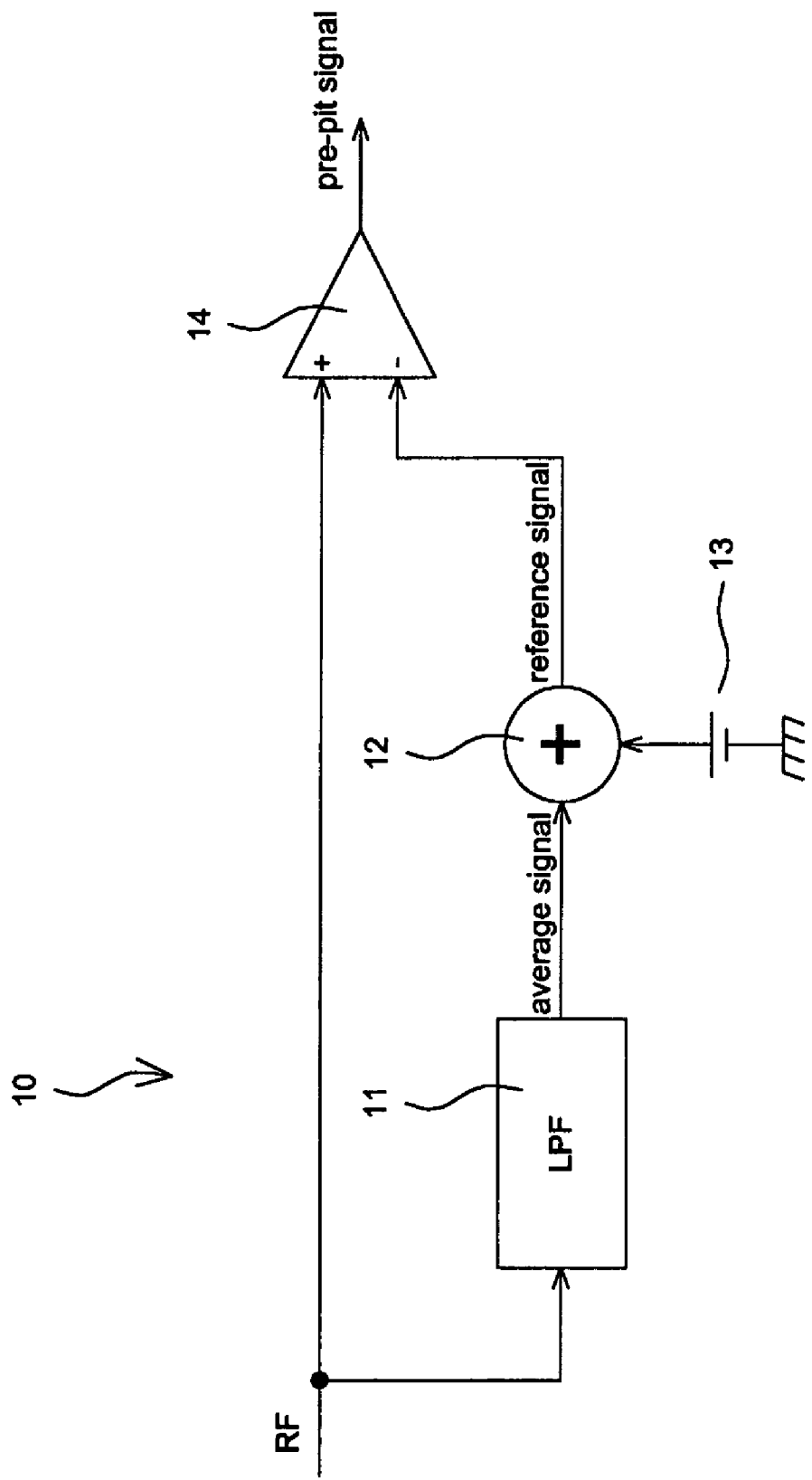
FIG. 1 shows an architecture diagram of a slicing device for slicing the pre-pit signal in a typical DVD-R recorder.
Figure 2:
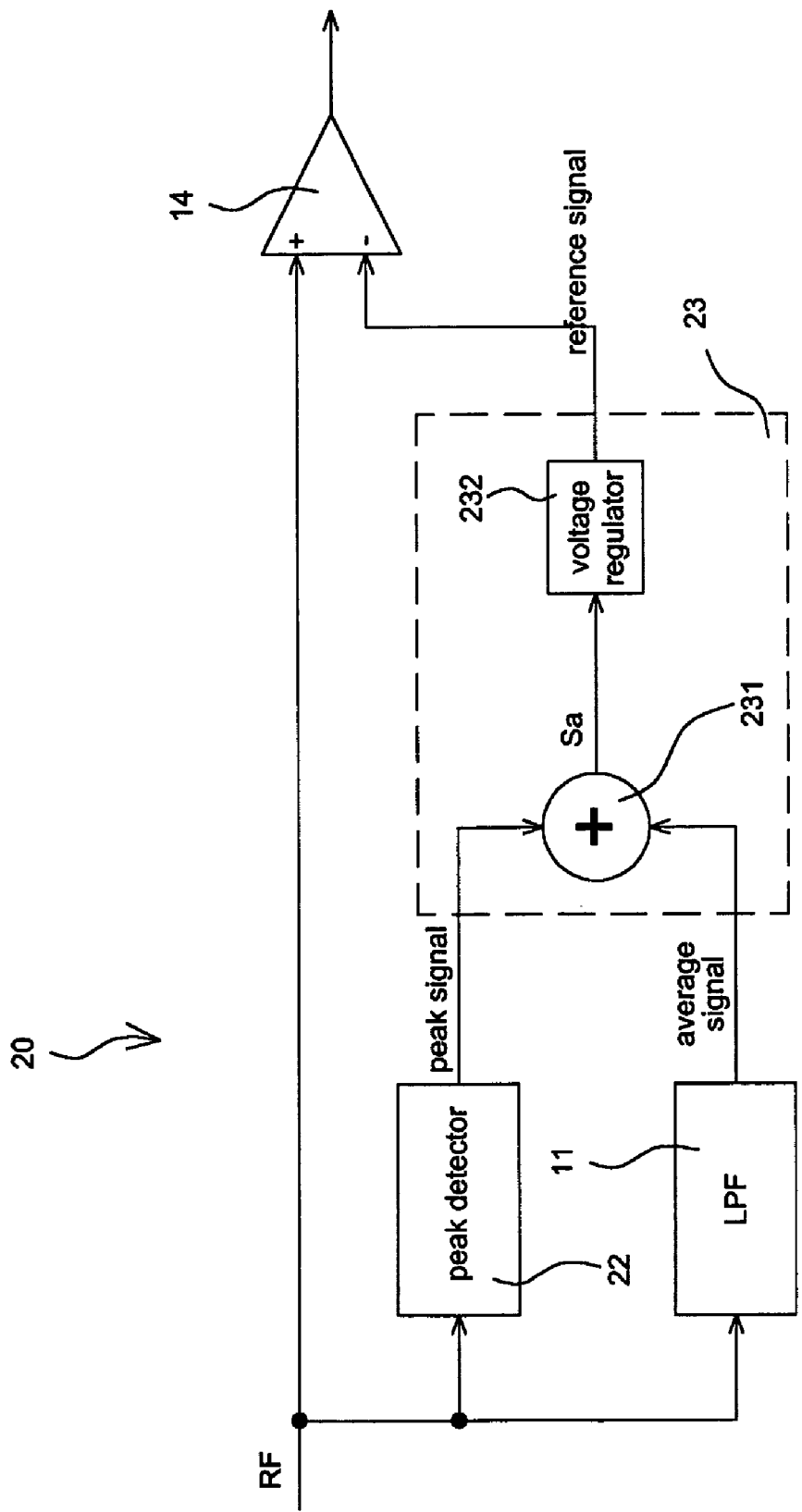
FIG. 2 shows an architecture diagram of another slicing device for slicing a pre-pit signal in a DVD-R recorder.
Figure 3:
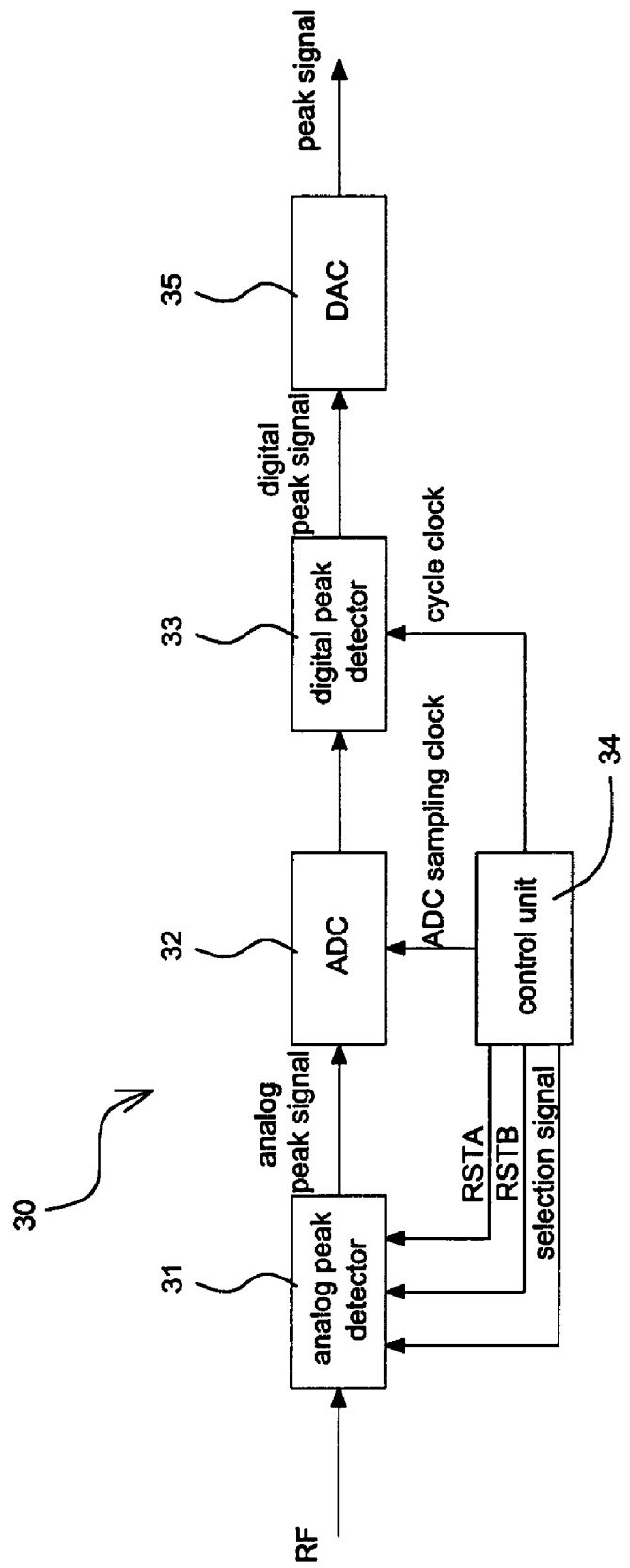
FIG. 3 shows a block diagram of a peak detection circuit with double peak detection stages according to the invention.

FIG. 3 shows a block diagram of a peak detection circuit with double peak detection stages according to the invention. Referring to FIG. 3, the peak detection circuit 30 of the invention includes an analog peak detector 31, an analog-to-digital converter (ADC) 32, a digital peak detector 33, a control unit 34, and a digital-to-analog converter (DAC) 35.

The analog peak detector 31 receives an input signal, such as an RF signal, periodically detects the peak value of the input signal with a first period, and outputs an analog peak signal. Because the analog peak detector 31 detects the peak value of the input signal with the shorter detection period, it is not necessary to use large capacitor. Thus, the response speed is increased, and the influence of the current leakage may be eliminated. The ADC 32 receives the analog peak signal output from the analog peak detector 31, and converts the analog peak signal into a digital signal. The digital peak detector 33 receives the digital signal and periodically detects the peak value of the received digital signal with a second period longer than the first period. The control unit 34 generates control signals, such as selection signal, reset signals RSTA and RSTB, ADC sampling clock and cycle clock, to control the operations of the analog peak detector 31, the ADC 32, and the digital peak detector 33. The DAC 35 converts the digital peak signal output from the digital peak detector 33 into an analog signal, which will be used in a rear stage.

Figure 4:
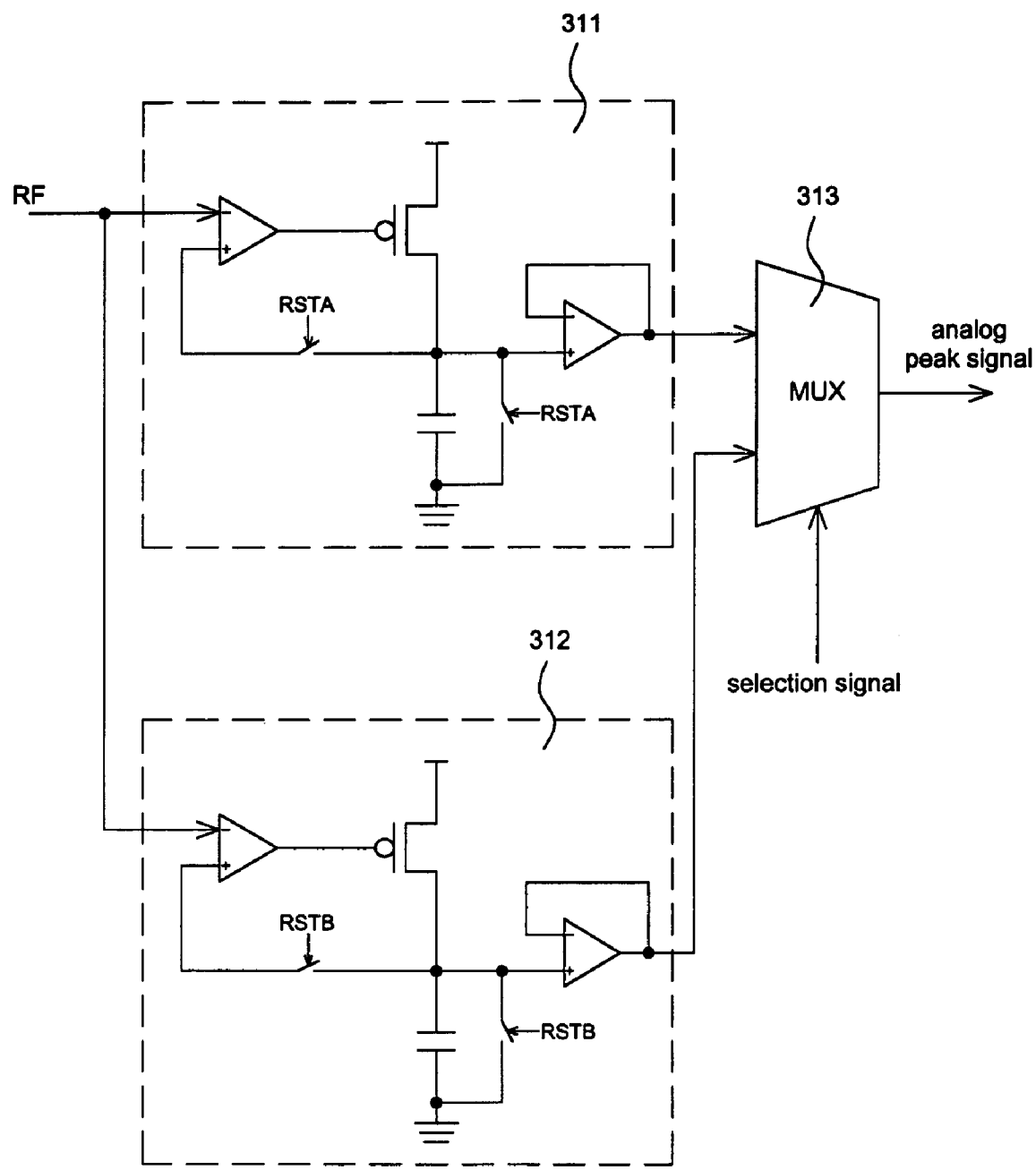
FIG. 4 shows a block diagram of an analog peak detector.

FIG. 4 shows a block diagram of an analog peak detector. Referring to FIG. 4, the analog peak detector 31 includes two detecting units 311 and 312, and one multiplexer 313. The units 311 and 312 have the same architecture, but operate at different time points. The reason why the analog peak detector 31 uses two detecting units 311 and 312 is to match with the operation of the ADC 32. When one detecting unit is outputting a signal to enable the ADC 32 to sample, the other peak detector may continue detecting the peak value so as to avoid any signal omission. The first detecting unit 311 is contolled by the rest signal RSTA while the second detecting unit 312 is controlled by the reset RSTB. In addition, the multiplexer 313 receives output signals of the detecting units 311 and 312, and selects one of the signal for output under the control of a selection signal.

FIGS. 5A to 5D show schematic illustrations of controls signals of the control units, wherein FIG. 5A shows the ADC sampling clock, FIG. 5B shows the selection signal, FIG. 5C shows the reset signal RSTA, and FIG. 5D shows the reset signal RSTB. As shown in the drawings, the first detecting unit 311 detects the peak value of the input signal RF when the reset signal RSTA is low (disabled), and clears the charged voltage of the capacitor when the reset signal RSTA is high (enabled). Similarly, the second detecting unit 312 detects the peak value of the input signal RF when the reset signal RSTB is low (disabled), and clears the charged voltage of the capacitor when the reset signal RSTB is high(enabled). The definition of the first period is shown in FIG. 5B. As shown in FIG. 5B, the selection signal changes its state at each sampling edge (falling edge) of the ADC sampling clock with delaying time t3. In addition, each of the reset signals RSTA and RSTB is set to a low potential at the time of t1 before the sampling edge (falling edge) of the ADC sampling clock, and set to a high potential at the time of t2 after the sampling edge (falling edge) of next pulse of the ADC sampling clock.

Figure 6A:
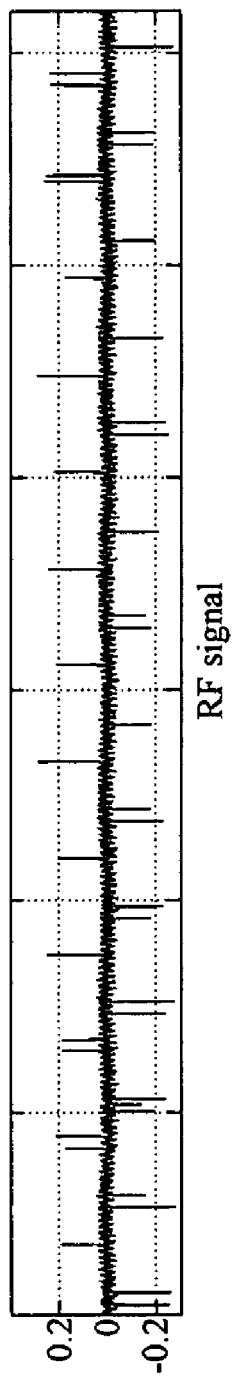
Figure 6B:
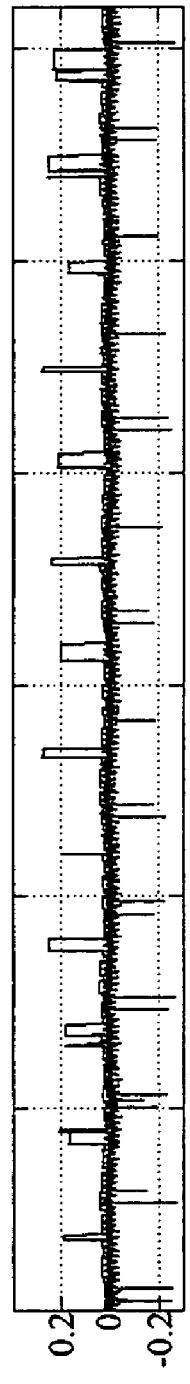
Figure 6C:
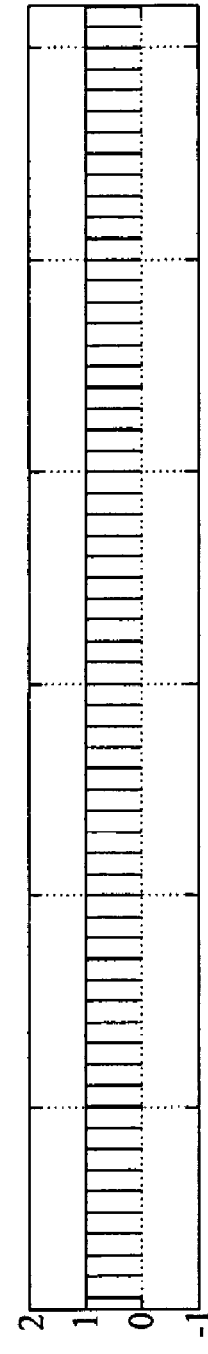
Figure 6D:
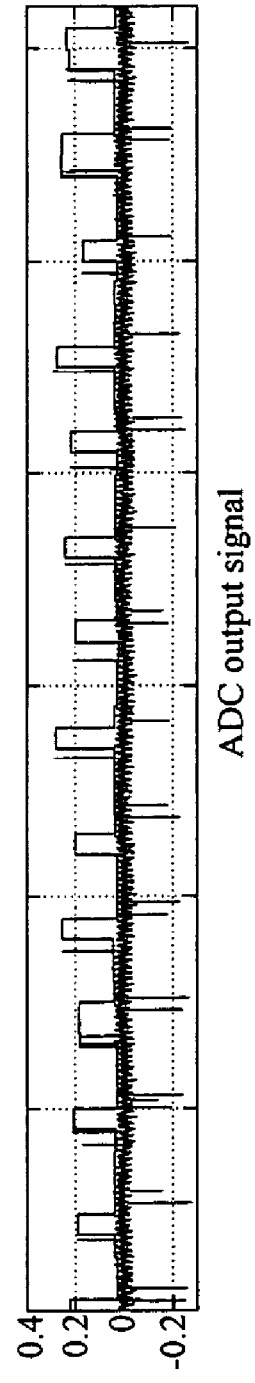

FIGS. 6A to 6D show schematic illustrations of some signals of the pre-pit signal detector applied to the optical disk system, wherein FIG. 6A shows the RF signal, FIG. 6B shows the analog peak signal, FIG. 6C shows the ADC sampling clock, and FIG. 6D shows the ADC output signal. As shown in FIG. 6A, the RF signal has upward surges, which correspond to the pre-pit signal. The pre-pit signal detector is used to detect the pre-pit signal. The analog peak detector 31 of the invention receives the RF signal and detects the peak value of the RF signal (i.e., the peak value of the pre-pit signal). The analog peak signal of FIG. 6B represents the output signal of the analog peak detector 31. It can be understood from FIG. 6B that the analog peak signal is sliced piecewisely and then digitized by the ADC according to the ADC sampling clock to generate the ADC output signal of FIG. 6D.

FIGS. 7A to 7C show schematic illustrations of some signals of the pre-pit signal detector applied to the optical disk system of the invention, wherein FIG. 7A shows the ADC output signal, FIG. 7B shows the cycle clock, and FIG. 7C shows the digital peak signal. The digital peak detector 33 of the invention generates the peak value output (i.e., the peak signal of FIG. 7C) in each cycle from the ADC output signal of FIG. 7A according to the cycle clock of FIG. 7B. The definition of the second period is shown in FIG. 7B. Therefore, it is clear that the second period is longer than the first period.

Because the peak detection circuit 30 of the invention utilizes the analog peak detector 31 to detect the peak value of the input signal with the first period shorter than the second period, the decay of the peak value caused by the current leakage may be reduced. Thereafter, the peak detection circuit 30 of the invention utilizes the ADC 32 to convert the analog peak signal output from the analog peak detector 31 into the digital signal, and utilizes the digital peak detector 33 to detect the peak value of the digital signal output from the ADC 32 with a longer period. Consequently, the peak detector with double peak detection stages of the invention may hold the peak value for a long time.

While certain exemplary embodiments have been described and shown in the accompanying drawings, it is to be understood that such embodiments are merely illustrative of and not restrictive on the broad invention, and that this invention not be limited to the specific construction and arrangement shown and described, since various other modifications may occur to those ordinarily skilled in the art.

What is claimed is:

1. A peak detection circuit with double peak detection stages, comprising:
    an analog peak detector for receiving an analog input signal, detecting a peak value of the analog input signal periodically with a first duration of time, and outputting an analog peak signal;
    an analog-to-digital convertor for receiving the analog peak signal, and converting the analog peak signal into a digital signal in accordance with a sampling clock having a duration of time substantially equal to the first duration of time; and
    a digital peak detector for receiving the digital signal, detecting a peak value of the digital signal periodically with a second duration of time longer than the first duration of time, and outputting a digital peak signal;
    wherein the analog peak detector comprising:
    a first detector for receiving the analog input signal, operating when a first control signal is enabled, and outputting a first peak signal;
    a second detector for receiving the analog input signal, operating when a second control signal is enabled, and outputting a second peak signal; and
    a multiplexer for receiving the first peak signal and the second peak signal, and selecting the first peak signal or the second peak signal to be output as the analog peak signal according to a selection signal.

2. The peak detection circuit according to claim 1, further comprising a digital-to-analog convener for receiving the digital peak signal and converting the digital peak signal into an analog signal.

3. The peak detection circuit according to claim 1, further comprising a control unit for outputting the first control signal, the second control signal and the selection signal so as to control an operation of the analog peak detector.

4. The peak detection circuit according to claim 3, wherein the control unit further outputs a sampling clock to control the operation of the analog-to-digital converter.

5. The peak detection circuit according to claim 3, wherein the control unit further outputs a cycle clock to control the operation of the digital peak detector.

6. The peak detection circuit according to claim 5, wherein the duration of time of the cycle clock is equal to the second duration of time.

* * * * *